United States Patent

Luning et al.

Patent Number: 6,127,222
Date of Patent: Oct. 3, 2000

[54] NON-SELF-ALIGNED SIDE CHANNEL IMPLANTS FOR FLASH MEMORY CELLS

[75] Inventors: Scott D. Luning, San Francisco; Mark Randolph, San Jose, both of Calif.

[73] Assignee: Advanced Micro Devices, Inc., Sunnyvale, Calif.

[21] Appl. No.: 08/991,687

[22] Filed: Dec. 16, 1997

[51] Int. Cl.⁷ .................................................. H01L 21/336
[52] U.S. Cl. ........................ 438/257; 438/264; 438/286
[58] Field of Search ............................ 257/344; 438/286, 438/257, 275, 301, 305, 264

[56] References Cited

U.S. PATENT DOCUMENTS

| | | | |
|---|---|---|---|
| 4,642,881 | 2/1987 | Matsukawa et al. | 29/576 B |
| 4,699,690 | 10/1987 | Arakawa | 156/662 |
| 5,019,527 | 5/1991 | Ohshima et al. | 438/257 |
| 5,021,848 | 6/1991 | Chiu | 357/23.5 |
| 5,147,811 | 9/1992 | Sakagami | 438/257 |
| 5,258,095 | 11/1993 | Nagata et al. | 438/257 |
| 5,286,665 | 2/1994 | Muragishi et al. | 438/257 |
| 5,427,963 | 6/1995 | Richart et al. | 437/41 |
| 5,510,279 | 4/1996 | Chien et al. | 437/41 |
| 5,512,503 | 4/1996 | Hong | 437/43 |
| 5,518,942 | 5/1996 | Shrivastava | 437/43 |
| 5,744,371 | 4/1998 | Kadosh et al. | 437/24 |
| 5,817,557 | 10/1998 | Baldi | 438/264 |
| 5,830,788 | 11/1998 | Hiroki et al. | 438/199 |
| 5,893,739 | 4/1999 | Kadosh et al. | 438/286 |
| 5,903,029 | 5/1999 | Hayashida et al. | 257/344 |
| 5,981,342 | 11/1999 | Kakoschke et al. | 438/266 |

OTHER PUBLICATIONS

S. Wolf and R.N. Tauber, Silicon Processing for the VLSI Era, vol. 1, Lattice Press, pp. 303–308.
S. Wolf, Silicon Processing for the VLSI Era, vol. 2, Lattice Press, pp. 589–591.

Primary Examiner—John F. Niebling
Assistant Examiner—Walter L. Lindsay, Jr.
Attorney, Agent, or Firm—Sawyer Law Group LLP

[57] ABSTRACT

A system and method for providing a flash memory cell on a semiconductor substrate are disclosed. The system and method include providing a side implant and providing an implant in at least one of a drain or a source of the flash memory cell.

17 Claims, 2 Drawing Sheets

NON-SELF-ALIGNED SIDE CHANNEL IMPLANTS FOR FLASH MEMORY CELLS

FIELD OF THE INVENTION

The present invention relates to flash memory and more particularly to a method and system for providing drain or source side channel implants without requiring a high angle implant.

BACKGROUND OF THE INVENTION

Flash memory cells are conventionally floating gate devices such as floating gate transistors formed on a semiconductor substrate. These memory cells are typically formed using self-aligned implants for the drain and the source. To create a memory cell, a gate stack is typically provided. The gate stack conventionally includes at least floating gate and a control gate disposed above the floating gate. The drain and the source are then formed by implanting the appropriate dopants around the gate stack. Thus, the gate stack is used as a mask to ensure that the source and drain are separated.

Currently, the length of flash memory cells are limited in part by the drain to source breakdown. At short channel lengths or high drain voltages, source to drain breakdown can occur. This breakdown causes the depletion of the source region to meet the depletion of the drain region, electrically coupling the drain and the source and preventing the memory cell from functioning correctly.

In order to reduce the drain to source breakdown, some conventional systems use a side implant, such as a drain side implant. These side implants are typically performed drain. Thus, these side implants increase the resistance of the memory cell to source to drain breakdown. For example, for a p channel memory cell, the dopant used is a p dopant, such as boron. The boron is implanted so that it is in the channel, typically next to the drain and should not be present at the source.

Because the implant is of a different type than the source, the implant should end before reaching the source. This is because the erase time is a function of the overlap between the gate and the source. If the side implant, which is of a different dopant type from the source, reaches the source, the time taken to erase the memory cell increases. Thus, the side implant should not overlap with the source.

In order to provide drain side implants in a conventional memory cell, the side implants are performed after the drain and source have been formed. To place these implants in the channel between the drain and source, and under the gate, large angle implants are used. For example, implants having a direction of approximately thirty to forty five degrees from normal to the surface of the semiconductor are used.

Although high angle implants can be used to provide a side implant, there are several disadvantages of high angle implants. Conventional implanters operate at angle on the order of six to seven degrees from normal to the semiconductor surface. In order to provide an implant at significantly higher angles, the manufacturing facility will have to change the implant angle drastically, which is difficult to do. In addition, high angle implants are difficult to tailor to specific structures. Finally, the reach of the high angle implant under the gate is somewhat limited.

Accordingly, what is needed is a system and method for providing a flash memory cell having increased resistance to breakdown without the drawbacks of conventional high angle implants. The present invention addresses such a need.

SUMMARY OF THE INVENTION

The present invention provides a method and system for providing a flash memory cell on a semiconductor substrate. The system and method comprise providing a side implant and providing an implant in at least one of a drain or a source of the flash memory cell.

According to the system and method disclosed herein, the present invention allows for side implants which can be more easily tailored and can reach relatively far under the gate of a memory cell, without the drawbacks of conventional high angle implants.

DETAILED DESCRIPTION OF THE INVENTION

The present invention relates to an improvement in flash memory cells. The following description is presented to enable one of ordinary skill in the art to make and use the invention and is provided in the context of a patent application and its requirements. Various modifications to preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
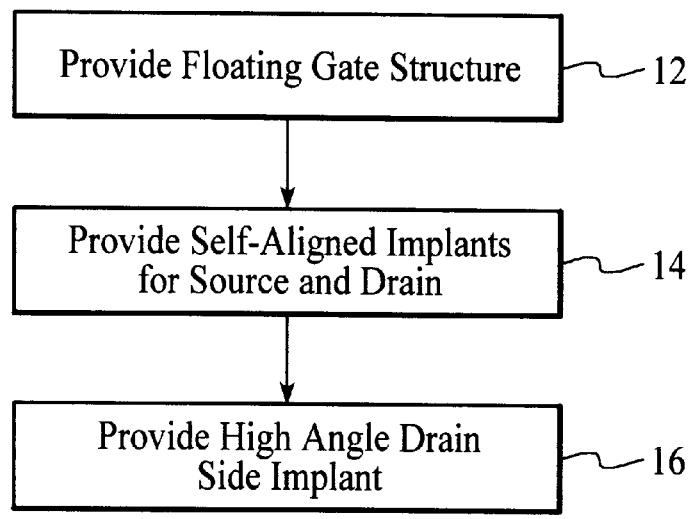
FIG. 1 is a flow chart of a method for providing a conventional flash memory cell including a side implant.

FIG. 1 is a flow chart of a method 10 for providing a conventional flash memory cell. Flash memory cells are conventionally floating gate devices such as floating gate transistors formed on a semiconductor substrate. Typically, a floating gate stack is formed first, via step 12. The gate stack conventionally includes at least a floating gate and a control gate disposed above the floating gate. Self-aligned implants drain and source are then carried out via step 14. In the self-aligned implant step 14, the gate stack is used as a mask to ensure that the source and drain are separated. In order to reduce the drain to source breakdown, a high angle side implant is performed via step 16. The dopant used for the side implant is typically the of the same type as the channel. For an n-type source and an n-type drain, therefore, the side implant is typically p type, such as boron. The side implant step 16 helps prevent source to drain break down or punch through at shorter channel lengths and higher drain voltages.

Figure 2:
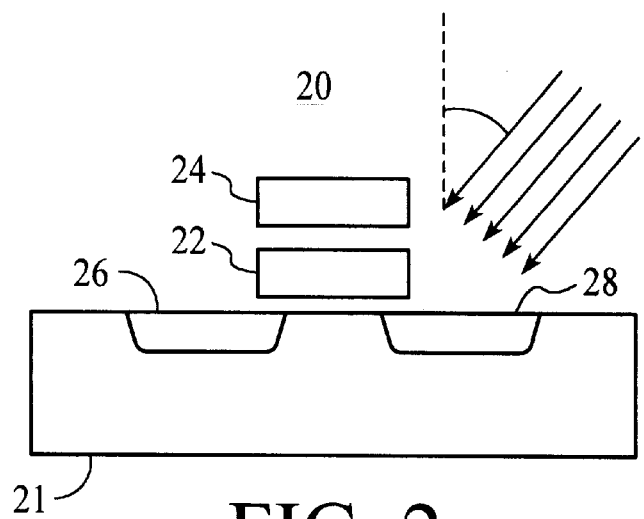
FIG. 2 is a block diagram depicting a conventional flash memory cell.

FIG. 2 depicts a conventional flash memory cell 20 formed in accordance with the method 10 during the high angle side implant step 16. As discussed above, the gate stack including the floating gate 22 and the control gate 24 are formed on the semiconductor substrate 21 first, via step 12. The source 26 and drain 28 are then formed via step 14. Typically, the side implant depicted in FIG. 2 is a drain side implant performed at an angle of approximately thirty to forty five degrees from normal to the surface.

Because the side implant is of a different type than the source, the implant should end before reaching the source. This is because the erase time is a function of the overlap between the gate and the source. If the side implant, which is of a different dopant type from the source, reaches the source, the time taken to erase the memory cell increases. Thus, the side implant should not overlap with the source.

Although the method 10 shown in FIG. 1 is capable of providing a flash memory cell, those with ordinary skill in the art will realize that the high angle implant step 16 has several drawbacks. Conventional implanters operate at angle on the order of six to seven degrees from normal to the semiconductor surface. In order to provide an implant at significantly higher angles, the manufacturing facility will have to change the implant angle drastically. This makes manufacturing of the flash memory cell 20 more difficult. In addition, high angle implants are difficult to tailor to specific structures. Finally, the reach of the high angle implant under the gate is somewhat limited.

The present invention provides for a method and system for providing side implants without the drawbacks of high angle implants. The present invention will be described in terms of a side implant of a particular type. However, one of ordinary skill in the art will readily recognize that this method and system will operate effectively for other types of dopant types.

Figure 3:
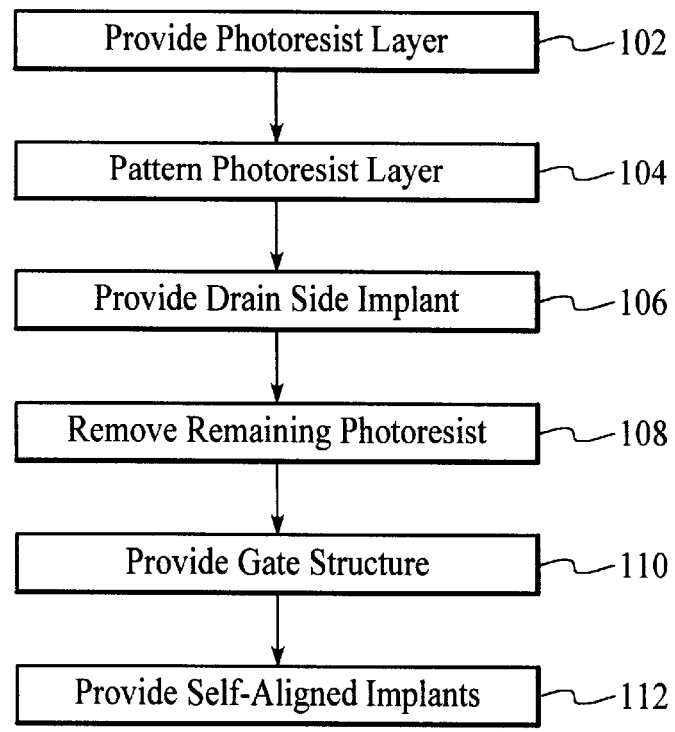
FIG. 3 is a flow chart of a method for providing a flash memory cell in accordance with the present invention.

To more particularly illustrate the method and system in accordance with the present invention, refer now to FIG. 3 depicting a flow chart of one embodiment of such a method 100. For the sake of clarity, only relevant steps are depicted in the method 100. However, nothing prevents other steps from being performed in forming a flash memory cell in accordance with the present invention.

The method 100 in accordance with the present invention first provides a layer of photoresist via step 102. The photoresist is then patterned to expose regions which will make up the side implant via step 104. In a preferred embodiment, the side implant is a drain side implant. The side implant is then performed via step 106. Because the side implant need not pass under a gate stack, the side implant can be performed at conventional angles, for example within approximately ten degrees of normal to the surface of a semiconductor substrate. In a preferred embodiment, the dopant for the side implant is a p-type dopant. Also in a preferred embodiment, the p-type dopant is boron or indium. Indium is a preferred dopant for the side implant step 106 because indium diffuses less than other dopants, such as boron, during subsequent heat cycling. This reduced diffusion allows the size of the drain to be better tailored. In addition, the side implant step 106 can provide the dopant through a floating gate and the tunnel oxide underlying the floating gate to reduce thermal cycling of implanted layer. The side implant step 106 can provide the dopant through the floating gate and tunnel oxide where the floating gate and tunnel oxide are thin enough to allow the dopant to reach the underlying semiconductor. Finally, the side implant step 106 could also include a source side implant. A source side implant is typically used to counteract the affects of the p-type dopant in channel or the p-type drain side implant, allowing for reduced erase time. Thus, a side implant performed for the source side typically uses a dopant of the same type as the source.

Once the side implant is provided, the remaining photoresist can be removed via step 108. A gate stack is then provided via step 110. In a preferred embodiment, the gate stack includes at least a floating gate and a control gate. Self-aligned implants are then performed via step 112. In a preferred embodiment, the self-aligned implants are the drain and source implants.

Figure 4A:
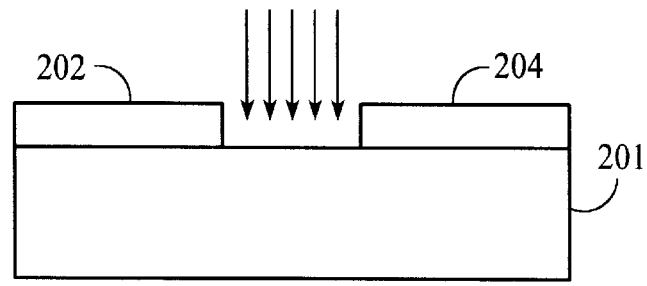
FIG. 4A is a block diagram depicting a flash memory cell in accordance with the present invention during implanting of the side implant.
Figure 4B:
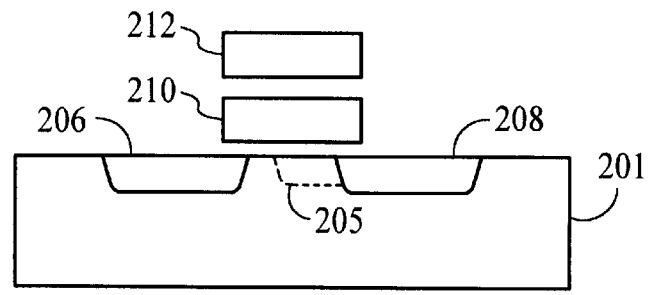
FIG. 4B is a block diagram depicting a flash memory cell in accordance with the present invention.

FIGS. 4A and 4B depict a flash memory cell 200 formed on a semiconductor substrate 201 in accordance with the present invention. FIG. 4A depicts the memory cell 200 during the side implant step 106. FIG. 4B depicts the memory cell 200 after the self-aligned implants have been completed. Referring now to FIG. 4A, because the side implant is performed prior to self-aligned implants, the side implant can be performed in a direction that is substantially perpendicular to the surface of the semiconductor substrate 201.

FIG. 4B depicts the flash memory cell 200 after completion of the source and drain implants via step 112. The memory cell 200 includes the side implant 205, the drain 206, the source 208, the floating gate 210, and the control gate 212. Because the side implant 205 was formed prior to a gate stack including at least the floating gate 210 and the control gate 212, a more tailored vertical profile is obtained. For example, the depth of the side implant 205 can be better controlled since the implant direction for the side implant 205 is relatively close to normal to the surface of the semiconductor 201. Finally, one constraint on the side implant 205 is that the side implant 205 not reach the source 206, preventing an increase in erase times. Thus, the misalignment allowed between the side implant and the self-aligned implants is close to the length of the floating gate 210. Consequently, providing the side implant 205 prior to the self-aligned source 206 and drain 208 does not greatly complicate the method 100 for providing the flash memory cell 200.

A method and system has been disclosed for providing a flash memory cell 200 having increased resistance to source to drain breakdown and simplified processing. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing at least one flash memory cell on a semiconductor substrate, the at least one flash memory cell including a gate stack, a source and a drain having dopants of a first conductivity type, the method comprising the sequential steps of:

(a) providing a floating gate for the gate stack, the floating gate having a thickness which allows a dopant to be implanted through the floating gate in the region of the semiconductor;

(b) providing a side implant, the step of providing a side implant including the steps of (b1) providing a mask having an aperture therein, the mask for implanting a region of the semiconductor under the gate stack, the aperture located above the region, and (b2) implanting a dopant in a direction substantially perpendicular to a surface of the semiconductor device, the dopant traveling through the aperture and through the floating gate, the dopant having a second conductivity type that is different from the first conductivity type if the side implant is a drain side implant; and (c) providing an implant in at least one of the drain and the source of the at least one flash memory cell.

2. The method of claim 1 wherein the dopant implanting step (b2) further includes the step of:

(b2i) implanting the dopant in a direction of the dopant that is within approximately seven degrees of perpendicular to the surface of the semiconductor substrate.

3. The method of claim 1 wherein the at least one drain or the source implant step (c) further includes the step of:

(c1) providing a self-aligned implant in at least one of the drain or the source.

4. The method of claim 3 wherein the self-aligned implant providing step (c1) further includes the steps of:

(c1i) providing a gate stack; and (c1ii) implanting a dopant in at least one of the drain or the source using the gate stack as at least a portion of a mask.

5. The method of claim 4 wherein the dopant is a p type dopant.

6. The method of claim 5 wherein the dopant is boron.

7. The method of claim 5 wherein the dopant is indium.

8. The method of claim 4 wherein the dopant is a same type as for the source.

9. The method of claim 1 wherein the at least one of the drain or the source further implant providing step (c) includes the step of:

(c1) providing an implant in both the drain and the source.

10. The method of claim 9 wherein the dopant implanting step (b2) further includes the step of:

(b2i) implanting the dopant in a direction of the dopant is that is within approximately seven degrees of perpendicular to the surface of the semiconductor substrate.

11. The method of claim 10 wherein the dopant is a p type dopant.

12. The method of claim 11 wherein the dopant is boron.

13. The method of claim 11 wherein the dopant is indium.

14. The method of claim 10 wherein the dopant is a same type as for the source.

15. The method of claim 12 wherein the implant for the drain and the source are self-aligned implants.

16. The method of claim 13 wherein the implant for the drain and the source are self-aligned implants.

17. The method of claim 14 wherein the implant for the drain and the source are self-aligned implants.

* * * * *